(12) United States Patent
Chew et al.

(10) Patent No.: US 7,601,940 B2
(45) Date of Patent: Oct. 13, 2009

(54) GAIN CONTROL SYSTEM FOR VISIBLE LIGHT COMMUNICATION SYSTEMS

(75) Inventors: Gim Eng Chew, Penang (MY); Aik Yean Tang, Kedah (MY); Mei Yee Ng, Perak (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 13 days.

(21) Appl. No.: 11/690,019

(22) Filed: Mar. 22, 2007

(65) Prior Publication Data
US 2008/0230684 A1 Sep. 25, 2008

(51) Int. Cl.
*H03G 3/20* (2006.01)
*G01J 1/44* (2006.01)
*H03F 3/08* (2006.01)

(52) U.S. Cl. .......................... 250/214 AG; 250/214 B; 330/308

(58) Field of Classification Search ........... 250/214 AG, 250/214 A, 214 AL, 214 B; 398/208–210; 330/284, 308
See application file for complete search history.

(56) References Cited

U.S. PATENT DOCUMENTS

| | | | | |
|---|---|---|---|---|
| 4,449,045 A * | 5/1984 | Colvin | ................. | 250/214 AG |
| 5,168,148 A * | 12/1992 | Giebel | ................... | 235/462.26 |
| 6,198,230 B1 * | 3/2001 | Leeb et al. | ................... | 315/224 |
| 6,593,810 B2 * | 7/2003 | Yoon | ........................... | 330/69 |
| 2005/0200421 A1* | 9/2005 | Bae et al. | ..................... | 330/308 |
| 2006/0229046 A1* | 10/2006 | Bult et al. | ................ | 455/252.1 |
| 2007/0098416 A1* | 5/2007 | Nogami et al. | .............. | 398/208 |

* cited by examiner

*Primary Examiner*—Thanh X Luu

(57) ABSTRACT

An optical receiver having a photodetector, a variable gain amplifier, and a gain control circuit is disclosed. The photodetector generates a photodetector output signal related to an intensity of light received by the photodetector, the photodetector output signal being characterized by a peak-to-peak signal value. The variable gain amplifier amplifies the photodetector output signal to generate a receiver output signal that is coupled to an external device, the variable gain amplifier having a gain that is determined by a gain control signal. The gain control circuit receives the receiver output signal and generates the gain control signal therefrom. The gain control signal causes the gain of the variable gain amplifier to decrease as a function of the peak-to-peak signal value to reduce changes in the output signal amplitude as a function of the input light signal amplitude.

18 Claims, 1 Drawing Sheet

GAIN CONTROL SYSTEM FOR VISIBLE LIGHT COMMUNICATION SYSTEMS

BACKGROUND OF THE INVENTION

Light-emitting diodes (LEDs) are attractive replacement candidates for conventional light sources based on incandescent bulbs and fluorescent light tubes. LEDs have higher energy conversion efficiency than incandescent lights and substantially longer lifetimes than both incandescent and fluorescent light fixtures. In addition, LED-based light fixtures do not require the high voltages associated with fluorescent lights.

In addition to providing a more cost-effective solution to the lighting problem, LED-based lighting systems have the potential of providing additional functionality that further increases the attractiveness of LEDs as replacements for conventional light systems. The light from an LED can be modulated at very high frequencies, since an LED can be turned on and off in a time of the order of a nano-second or less. Hence, LEDs can be used to send data by pulsing the LED to create a series of light pulses that represent the binary bits of the data that is being sent. Since the human eye cannot resolve these short light pulses, an observer will see only the average light intensity from the LED. Accordingly, a light source that is being utilized to light a room can, in principle, be used to transmit data to devices within the room as well without interfering with the lighting function in a manner that can be detected by a human observer.

Many LED light sources also include photodetectors and controllers that regulate the current through the LEDs to maintain the output at a specific color point and intensity. For example, systems in which the light source includes LEDs that generate different colors of light that are mixed to provide an output color that is maintained at a specified color point and intensity are known to the art. These light sources measure the output of the LEDs in a number of spectral bands and then adjust the intensity of light generated by the various LEDs to maintain the color point and intensity by controlling the average current through each LED. Since these devices already include both photodetectors and a controller, systems that utilize these components to further implement a data network have been suggested.

In such a system, the lighting unit also acts as a transponder for sending and receiving data. The data is sent by pulsing one or more of the LEDs. The LED that is pulsed can be one of the LEDs that is used to provide the lighting function or a separate LED that is reserved for the data transmission function. A photodetector in the light source acts as the receiver for the transponder. The photodiode can be a separate photodiode or one of the photodiodes used to monitor the output spectrum from the LEDs. In the latter case, the photodiode must also be able to view light that originates from sources outside the light source.

The data that is to be sent and the data that is to be received can be communicated over the power lines that are used to connect the light source to a power grid in a building. Systems that utilize the power grid as one component of a local area network in a building are known to the art. For example, these systems are used to provide wireless access points for the network. Analogous systems in which the lighting source provides the functionality of the wireless access point have been suggested. In such a system, a computer or other device would communicate on the network through an optical transponder that sends and receives data to the transponder in the lighting units within a room.

Such optically based local area network segments have the advantage of limiting the reception area to a specific room or area within that room. One problem with radio frequency network segments is the leakage of the signals into areas surrounding the area of interest within a building. The portion of the signal that escapes the building represents a security problem, as an eavesdropper can listen to the communications on the network or utilize the network assets without the permission of the network owner. To overcome the security problems, the signals must be encoded which increases the cost of the systems and computing overhead needed to communicate on the network.

In addition, the leaked signals make it difficult to implement another radio frequency based network in an adjacent area. The encrypted signal from one area appears to be noise in the adjacent area. In a commercial building in which a number of independent businesses are located in close proximity to one another, the effective range of a WiFi network can be reduced by the overlapping signals to the point that a single WiFi network cannot be implemented in one or more of the businesses. An optically based system, on the other hand, does not suffer from either the security problems or the noise problems.

One problem that is encountered in implementing such an optically based communication system is the large variation in signal strength that is encountered by the transponders. Consider a laptop computer operating in a room via a lighting system based optical network link. The laptop must include a light emitter and a light receiver that communicates with the transponder in the lighting system. The amount of light that is received by the light receiver in the laptop depends on the orientation of the receiver relative to the LED that is transmitting the signal in the overhead lighting system. In addition, the received light also depends on the orientation of the laptop receiver. Hence, the signal can vary over several orders of magnitude in intensity. This large range in intensities will interfere with the decoding of the signals unless some form of gain control is utilized to control the output of the receiver. Since cost is of prime importance in many of the devices that must communicate over the optical network link, any such gain control circuit is preferably implemented in conventional CMOS circuitry that can be incorporated in the controller used in the lighting system or in the controller used in the receiver in the consumer device.

SUMMARY OF THE INVENTION

The present invention includes an optical receiver having a photodetector, a variable gain amplifier, and a gain control circuit. The photodetector generates a photodetector output signal related to an intensity of light received by the photodetector, the photodetector output signal being characterized by a peak-to-peak signal value. The variable gain amplifier amplifies the photodetector output signal to generate a receiver output signal that is coupled to an external device, the variable gain amplifier having a gain being determined by a gain control signal. The gain control circuit receives the receiver output signal and generates the gain control signal therefrom. The gain control signal causes the gain of the variable gain amplifier to decrease as a function of the peak-to-peak signal value. In one aspect of the invention, the gain control circuit causes the gain of the variable gain amplifier to decrease linearly as a function of the peak-to-peak signal value over a predetermined range of peak-to-peak signal values.

DETAILED DESCRIPTION OF THE PREFERRED EMBODIMENTS OF THE INVENTION

Figure 1:
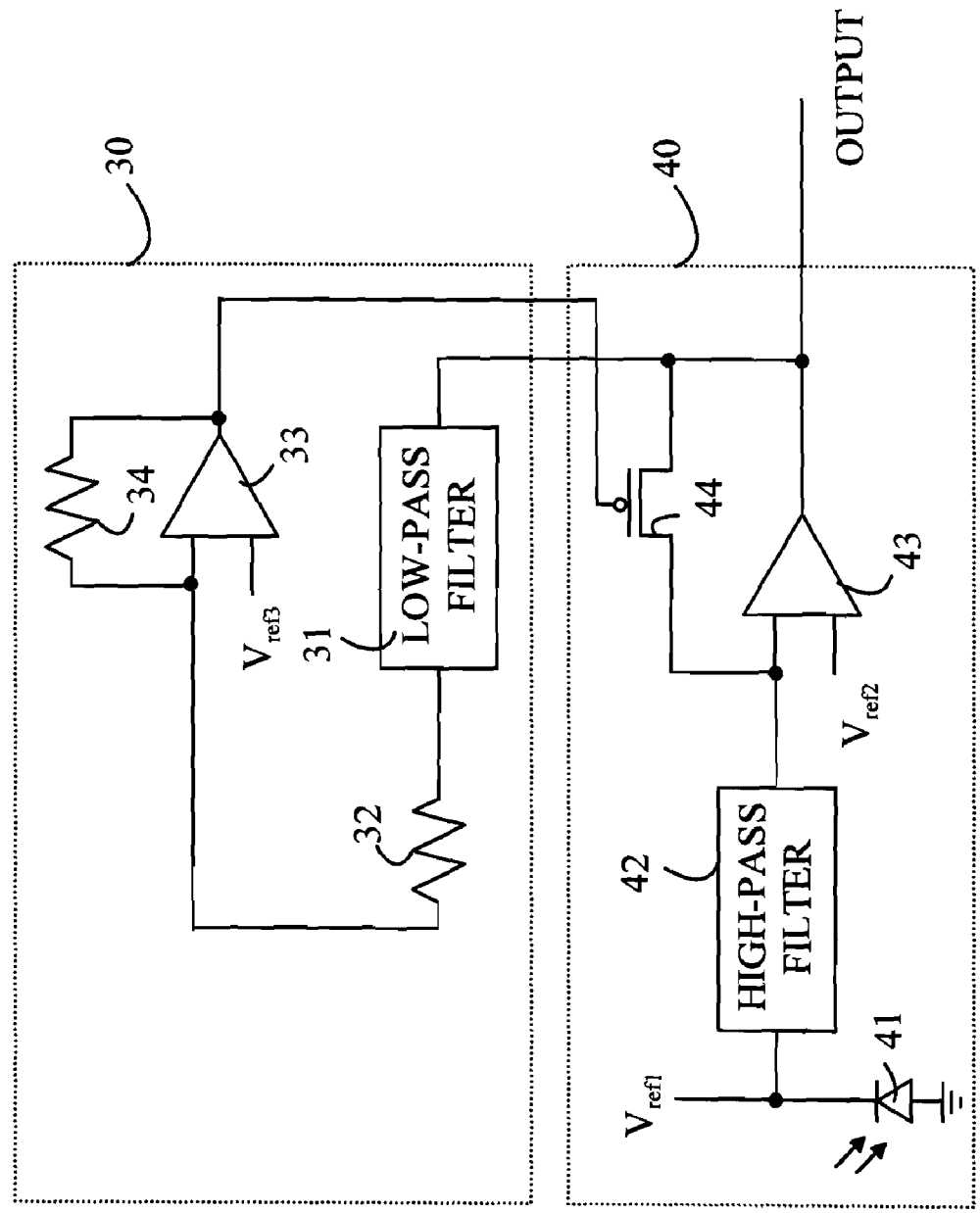
FIG. 1 illustrates an optical receiver according to one embodiment of the present invention.

The manner in which the present invention provides its advantages can be more easily understood with reference to FIG. 1, which illustrates an optical receiver according to one embodiment of the present invention. Optical receiver 20 can be viewed as having two blocks, a light communication block 40 and a gain control block 30. Light communication block 40 includes a photodiode 41 that receives light from the lighting system that is being modulated to communicate data. The signal from photodiode 41 is filtered through a high-pass filter 42 that removes any DC or slowly varying signal components that arise from other light sources that generate light that reaches photodiode 41. For example, photodiode 41 could receive ambient light during the daytime or light from other LEDs or other light emitters that are part of the lighting within the room in which optical receiver 20 is operating.

The output of high-pass filter 42 is amplified by amplifier 43 to provide the output signal. As noted above, the signal level at the input to amplifier 43 can vary over a very large range depending on the relative positions and orientations of photodiode 41 and the light source that is generating the light signal received by photodiode 41. At high signal levels, amplifier 43 could saturate, and hence, the data could be lost. To prevent such losses, the gain of amplifier 43 is adjusted in response to the average signal level at the output of amplifier 43. The gain of amplifier 43 is set by the feedback impedance between the input and output of operational amplifier 43. In the present invention, a variable gain element is used to set this impedance. Optical receiver 20 utilizes a MOSFET transistor 44 to provide gain. The input to transistor 44 is set by gain control block 30.

Ideally, the peak-to-peak output voltage from amplifier 43 should remain constant independent of the light levels received by photodiode 41. This can be accomplished by adjusting the control signal to transistor 44 such that the gain of amplifier 43 decreases linearly as a function of the peak-to-peak voltage of the input signal to amplifier 43 over the desired input light intensity range.

Gain control block 30 generates a signal that is related to the average potential of the output signal. The AC component of the output signal is removed by low-pass filter 31 to create a DC voltage that is a linear function of the peak-to-peak voltage of the output signal. The output of low-pass filter 31 is amplified by operational amplifier 33, which provides the control signal that regulates the impedance of transistor 44, and hence, the gain of amplifier 43. It can be shown that the gain of amplifier 43 is a linearly decreasing function of the peak-to-peak voltage of the input to the signal using the arrangement shown in FIG. 1. Hence, the output of amplifier 43 is maintained at a substantially constant level over a significant range of light levels. The gain and offset of this control signal are set by $V_{ref3}$ and resistors 32 and 34. If the input to amplifier 33 is greater than a preset value, the output of amplifier 33, and hence, the feedback resistance through transistor 44 will decrease, which, in turn, leads to a reduction in the gain of amplifier 43. The preset voltage is determined by a combination of resistor 32, resistor 34, $V_{ref3}$, and the size of the transistor 44.

The above-described embodiments of the present invention utilize a photodiode as the photodetector. However, embodiments of the present invention that utilize other forms of photodetector such as phototransistors can also be constructed.

Various modifications to the present invention will become apparent to those skilled in the art from the foregoing description and accompanying drawings. Accordingly, the present invention is to be limited solely by the scope of the following claims.

What is claimed is:

1. An optical system, comprising:
   a room lighting unit comprising a light emitting diode (LED) operable in the visible spectrum; and
   a communication system comprising:
     the LED of the room lighting unit configured for providing illumination and further configured for operating in a pulsed mode of operation at a pulse rate that is unnoticeable to a human eye; and
     an optical communications unit configured to receive light transmitted by the LED and derive therefrom, data embedded in the light using the pulsed mode of operation, the optical communications unit comprising:
       a photodetector configured to receive light transmitted by the LED of the room lighting unit and generate therefrom, a photodetector output signal;
       a high-pass filter coupled to the photodetector, the high-pass filter configured for blocking frequencies corresponding to ambient room light that is incident upon the photodetector while passing a filtered signal containing frequencies corresponding to the pulsed mode of operation;
       a variable gain amplifier coupled to the high-pass filter, the variable gain amplifier configured to receive the filtered signal and provide a variable gain that is dependent upon a desired amplitude of an output signal of the variable gain amplifier; and
       a gain control circuit coupled to the variable gain amplifier, the gain control circuit comprising:
         a low-pass filter coupled to an output node of the variable gain amplifier, the low-pass filter configured for blocking frequencies corresponding to the pulsed mode of operation while passing a control voltage that varies linearly in correspondence to a peak-to-peak voltage of the output signal of the variable gain amplifier; and
         a gain control amplifier coupled to the low-pass filter, the gain control amplifier including a pair of gain-setting resistors and a reference voltage, which are used by the gain control amplifier for generating a gain control signal, wherein the reference voltage is selected based upon the desired amplitude of the output signal of the variable gain amplifier.

2. The optical system of claim 1, wherein the room lighting unit is configured to provide lighting to a room, and wherein the optical communications unit is housed in a device located inside the room.

3. The optical system of claim 2, wherein the device is a personal computer (PC).

4. The optical system of claim 2, wherein the lighting provided by the room lighting unit comprises an average light intensity emitted by the LED when the LED is in the pulsed mode of operation.

5. The optical system of claim 2, wherein the optical communications unit housed in the device comprises an optical receiver that is optically coupled to the LED of the room lighting unit.

6. The optical system of claim 1, wherein the ambient room light is generated by a light source present in the room and the high-pass filter is configured for blocking frequencies contained in light generated by the light source.

7. The optical system of claim 1, wherein the light source comprises another LED different than the LED contained in the room lighting unit and the high-pass filter is configured for blocking frequencies contained in light generated by the another LED.

8. The optical system of claim 1, wherein the ambient room light is provided by daylight present in the room.

9. A method of communicating data to a device located inside a room, the method comprising:

providing a room lighting unit comprising a light emitting diode (LED) operable in the visible spectrum;

operating the room lighting unit for providing illumination in the room;

while providing illumination, operating the LED in a pulsed mode of operation for emitting an optical communication signal at a pulse rate that is undetectable by a human eye;

receiving in a photodetector that is housed in the device, incident light comprising the optical communication signal;

generating a photodetector output signal corresponding to the incident light;

deriving a first filtered signal by propagating the photodetector output signal through a high pass filter for rejecting signal components present in light that is received in the photodetector from a secondary light source; and amplifying the first filtered signal by propagating the first filtered signal though a variable gain amplifier that provides variable gain in accordance with a gain control signal that is generated at least in part, by: a) deriving a second filtered signal by propagating an output signal of the variable gain amplifier though a low-pass filter configured for blocking frequencies corresponding to the pulsed mode of operation, and b) amplifying the second filtered signal by propagating the second filtered signal through an amplifier circuit comprising a pair of gain-setting resistors, and a reference voltage that is selected based upon a desired amplitude of the output signal of the variable gain amplifier.

10. The method of claim 9, wherein the illumination provided by the room lighting unit comprises an average light intensity emitted by the LED when the LED is in the pulsed mode of operation.

11. The method of claim 9, wherein the secondary light source is another LED different than the LED contained in the room lighting unit.

12. The method of claim 9, wherein the light received in the photodetector from the secondary light source includes daylight present in the room.

13. A method of communicating data to a device located inside a room, the method comprising:

providing a room lighting unit for providing illumination, the room lighting unit comprising a light emitting diode (LED);

operating the LED in a pulsed mode of operation for emitting an optical communication signal towards the device;

receiving in a photodetector, incident light comprising the optical communication signal;

generating a photodetector output signal corresponding to the incident light;

deriving a first filtered signal by propagating the photodetector output signal through a first filter having a frequency response tailored to reject signal frequency components present in light emitted by an alternative light source and received in the photodetector; and amplifying the first filtered signal by propagating the first filtered signal through a variable gain amplifier that provides variable gain in accordance with a gain control signal that is generated at least in part, by: a) deriving a second filtered signal by propagating an output signal of the variable gain amplifier through a second filter having a frequency response tailored to block frequencies corresponding to the pulsed mode of operation, and b) amplifying the second filtered signal by propagating the second filtered signal through an amplifier circuit comprising a pair of gain-setting resistors, and a reference voltage that is selected based upon a desired amplitude of the output signal of the variable gain amplifier.

14. The method of claim 13, wherein the alternative light source is another LED different than the LED of the room lighting unit.

15. The method of claim 13, wherein the light received in the photodetector from the alternative light source comprises daylight.

16. The method of claim 13, wherein the first filter is a high-pass filter.

17. The method of claim 13, wherein the second filter is a low-pass filter.

18. The method of claim 13, wherein the first filter is a high-pass filter and the second filter is a low-pass filter.

* * * * *